US012099920B2

(12) United States Patent
Suzuki (10) Patent No.: US 12,099,920 B2
(45) Date of Patent: Sep. 24, 2024

(54) SEMICONDUCTOR DEVICE

(71) Applicant: RENESAS ELECTRONICS CORPORATION, Tokyo (JP)

(72) Inventor: Junichi Suzuki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 826 days.

(21) Appl. No.: 17/226,965

(22) Filed: Apr. 9, 2021

(65) Prior Publication Data

US 2021/0319301 A1 Oct. 14, 2021

(30) Foreign Application Priority Data

Apr. 10, 2020 (JP) ................................ 2020-070703

(51) Int. Cl.
| | |
|---|---|
| *G11C 7/06* | (2006.01) |
| *G06N 3/04* | (2023.01) |
| *G06N 3/065* | (2023.01) |
| *G11C 11/54* | (2006.01) |
| *G11C 16/04* | (2006.01) |

(52) U.S. Cl.
CPC .............. *G06N 3/065* (2023.01); *G06N 3/04* (2013.01); *G11C 11/54* (2013.01); *G11C 16/0433* (2013.01); *G11C 16/0466* (2013.01)

(58) Field of Classification Search
CPC .......... G06N 3/065; G06N 3/04; G11C 11/54; G11C 16/0433; G11C 16/0466
USPC .................................................. 365/189.07
See application file for complete search history.

(56) References Cited

U.S. PATENT DOCUMENTS

| | | | | |
|---|---|---|---|---|
| 10,431,287 | B2* | 10/2019 | Tanaka | G06N 3/049 |
| 11,335,813 | B2* | 5/2022 | Kobayashi | H10B 12/0335 |
| 11,526,329 | B2* | 12/2022 | Yabuuchi | G11C 11/418 |
| 11,908,947 | B2* | 2/2024 | Kozuma | G11C 14/00 |
| 2021/0384193 | A1* | 12/2021 | Kimura | H10B 12/00 |
| 2022/0236952 | A1* | 7/2022 | Fujinami | G06F 7/5443 |
| 2022/0261559 | A1* | 8/2022 | Shibata | H10N 70/00 |
| 2022/0276837 | A1* | 9/2022 | Fujinami | G06N 3/065 |
| 2023/0049977 | A1* | 2/2023 | Kurokawa | G06F 7/5443 |

OTHER PUBLICATIONS

Ming Cheng, et al., "TIME: A Training-in-memory Architecture for Memristor-based Deep Neural Networks", 2017 54th ACM/EDAC/IEEE Design Automation Conference (DAC).

\* cited by examiner

*Primary Examiner* — Viet Q Nguyen
(74) *Attorney, Agent, or Firm* — Rimon P.C.

(57) ABSTRACT

A first voltage application circuit applies a first voltage determined to have a first voltage value to a first wiring connected to an asymmetrical memory cell. A second voltage application circuit applies a second voltage determined to have a second voltage value to a second wiring connected to the asymmetrical memory cell. When receiving a first input value from a first terminal, a voltage control circuit fixes the second voltage value and changes the first voltage value with a positive inclination with respect to the first input value within a range equal to or higher than the second voltage value. When receiving a second input value from a second terminal, the voltage control circuit fixes the first voltage value and changes the second voltage value with a negative inclination with respect to the second input value within a range equal to or lower than the first voltage value.

8 Claims, 10 Drawing Sheets

VTBL

| Input | Vin | 0.0 | 0.2 | 0.4 | 0.6 |
|---|---|---|---|---|---|
| FP | Vbl | 0.2 | 0.4 | 0.6 | 0.8 |
| | Vsl | 0.2 | 0.2 | 0.2 | 0.2 |
| | Vcg | 1.2 | 1.2 | 1.2 | 1.2 |
| | Vwl | 1.2 | 1.2 | 1.2 | 1.2 |
| BP | Vbl | 0.6 | 0.6 | 0.6 | 0.6 |
| | Vsl | 0.6 | 0.4 | 0.2 | 0.0 |
| | Vcg | 1.7 | 1.45 | 1.2 | 0.95 |
| | Vwl | 1.7 | 1.45 | 1.2 | 0.95 |

VTBL2

| | | | | | | |
|---|---|---|---|---|---|---|
| | AI Vin | 0.00 | 0.25 | 0.50 | 0.75 | 1.00 |
| | Vin | 0.00 | 0.07 | 0.14 | 0.24 | 0.45 |
| FP | Vbl | 0.20 | 0.27 | 0.34 | 0.44 | 0.65 |
| | Vsl | 0.20 | ← | ← | ← | ← |
| | Vcg | 1.20 | ← | ← | ← | ← |
| | Vwl | 1.20 | ← | ← | ← | ← |
| BP | Vbl | 0.60 | ← | ← | ← | ← |
| | Vsl | 0.60 | 0.53 | 0.46 | 0.36 | 0.15 |
| | Vcg | 1.70 | 1.60 | 1.51 | 1.36 | 1.15 |
| | Vwl | 1.70 | 1.60 | 1.51 | 1.36 | 1.15 |

SEMICONDUCTOR DEVICE

CROSS-REFERENCE TO RELATED APPLICATIONS

The disclosure of Japanese Patent Application No. 2020-070703 filed on Apr. 10, 2020 including the specification, drawings and abstract is incorporated herein by reference in its entirety.

BACKGROUND

The present invention relates to a semiconductor device, for example, a semiconductor device used for the AI (Artificial Intelligence).

In order to perform the AI inference and learning (transfer learning), the transposed matrix operation is required. Non-Patent Document 1 shows the method of performing the transposed matrix operation using a cross-point RRAM. The cross-point RRAM has a symmetric memory cell using only a resistive element as a memory cell. The magnitude of the current flowing through the symmetric memory cell (resistive element) is not varied even when the voltage of the cross wiring connected to the memory cell is exchanged. Therefore, the transposed matrix operation can be easily realized.

There are disclosed techniques listed below. [Non-Patent Document 1] Ming Cheng, et al., "TIME: A Training-in-memory Architecture for Memristor-based Deep Neural Networks", 2017 54th ACM/EDAC/IEEE Design Automation Conference (DAC)

SUMMARY

In recent years, the AI (Artificial Intelligence) application market has grown, and the computing load, the communication load, and others in the cloud have been increasing. In addition, for example, in a production line or the like, there is a circumstance that it is not desired that the update of the confidential data required for the learning of AI is performed on the cloud. Therefore, a mechanism capable of performing the learning or partial learning (that is, transfer learning) in the endpoint, for example, the site of the production line is desired.

Examples of the method for rendering the endpoint intelligent with low power consumption include the method using a cross-point RRAM shown in Non-Patent Document 1. However, in the cross-point RRAM, not only selected memory cell but also non-selected memory cell is connected to the cross wiring. For this reason, it is not easy to ensure reliability due to the disturbance or the like to the non-selected memory cell. On the other hand, it is also conceivable to provide a selection transistor or the like in the memory cell in addition to the resistive element. However, in this case, there is a possibility that the symmetry of the memory cell cannot be obtained and it becomes difficult to realize the transposed matrix operation with high accuracy.

The other object and novel feature will become apparent from the description of this specification and attached drawings.

A semiconductor device according to an embodiment includes an arithmetic operation memory. The arithmetic operation memory includes: first wiring; a second wiring; a first terminal corresponding to the first wiring; a second terminal corresponding to the second wiring; an asymmetric memory cell; a first voltage application circuit; a second voltage application circuit; and a voltage control circuit. The asymmetric memory cell is connected between the first wiring and the second wiring and has a characteristic that a magnitude of a flowing current is varied when a voltage of the first wiring and a voltage of the second wiring are exchanged. The first voltage application circuit is configured to apply a first voltage determined to have a first voltage value to the first wiring. The second voltage application circuit is configured to apply a second voltage determined to have a second voltage value to the second wiring. The voltage control circuit is configured to determine the first voltage value and the second voltage value. Herein, in a first case of receiving a first input value from the first terminal, the voltage control circuit fixes the second voltage value and changes the first voltage value with a positive inclination with respect to the first input value within a range equal to or higher than the second voltage value. Further, in a second case of receiving a second input value from the second terminal, the voltage control circuit fixes the first voltage value and changes the second voltage value with a negative inclination with respect to the second input value within a range equal to or lower than the first voltage value.

By using the semiconductor device according to the embodiment, it is possible to realize the transposed matrix operation with high accuracy even in an asymmetric memory cell.

DETAILED DESCRIPTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification, details, or a supplementary explanation thereof. Also, in the embodiments described below, when mentioning the number of elements (including number of pieces, values, amount, range, and the like), the number of the elements is not limited to a specific number unless otherwise stated or except the case where the number is apparently limited to a specific number in principle, and the number larger or smaller than the specific number is also applicable.

Furthermore, in the embodiments described below, it goes without saying that each component (including an element step) is not indispensable unless otherwise clearly specified or unless it is obvious that the component is indispensable in principle. Likewise, in the embodiments described below, when mentioning a shape, a positional relation, or the like of a component, a substantially approximate shape, a similar shape, or the like is included unless otherwise clearly specified or unless it is obvious from the context that the shape, the positional relation, or the like of the component differs in principle. The same applies to the above-described numerical value and range.

Hereinafter, embodiments of the present invention will be described in detail with reference to the drawings. Note that components having the same function are denoted by the same reference characters throughout the drawings for describing the embodiments, and the repetitive description thereof is omitted. In addition, the description of the same or similar portions is not repeated in principle unless particularly required in the following embodiments.

Schematic Configuration of Semiconductor Device

Figure 1:
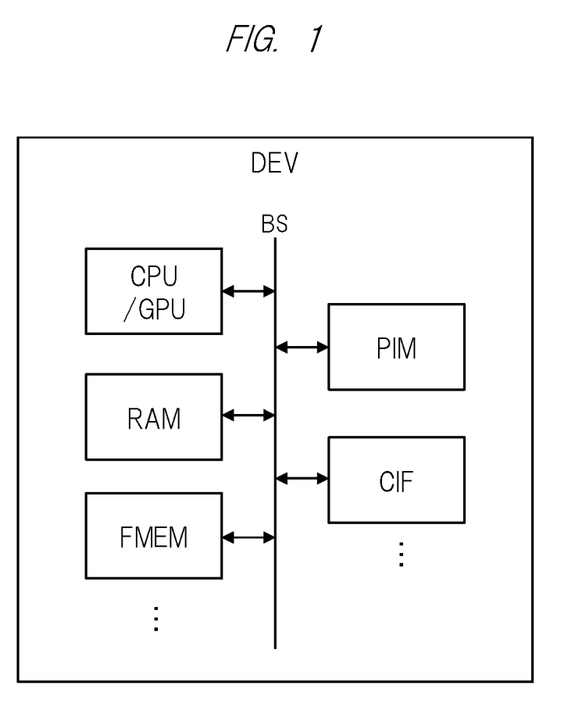
FIG. 1 is a block diagram showing a schematic configuration example of a semiconductor device according to an embodiment of the present invention.

FIG. 1 is a block diagram showing a schematic configuration example of a semiconductor device according to an embodiment of the present invention. The semiconductor device according to the embodiment is composed of, for example, one semiconductor chip. The semiconductor device is a microcontroller, an SoC (System on Chip), a single semiconductor memory device, or the like provided with at least an arithmetic operation memory PIM.

As an example thereof, a semiconductor device DEV of FIG. 1 includes, in addition to the arithmetic operation memory PIM, a CPU (Central Processing Unit) or GPU (Graphics Processing unit), a RAM (Random Access Memory), a flash memory FMEM, a communication interface CIF, and others. These components are connected to each other by a bus BS. Though described later in detail, the arithmetic operation memory PIM has a function to perform the product-sum operation required for the AI.

Arithmetic Operation Memory in AI

Figure 2:
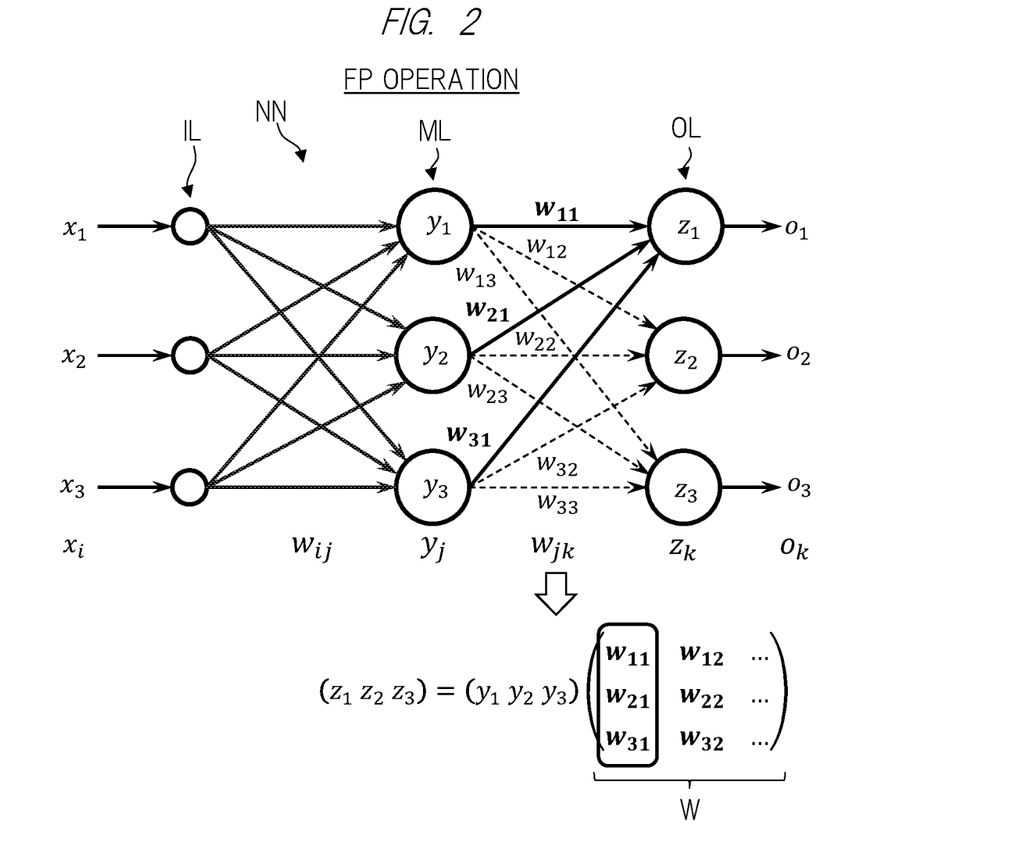
FIG. 2 is a schematic diagram illustrating an example of an inference operation in AI.

FIG. 2 is a schematic diagram illustrating an example of an inference operation in AI. FIG. 2 shows a neural network NN having multiple layers including an input layer IL, an intermediate layer ML, and an output layer OL. In FIG. 2, i pieces of input data $x_i$ are input to the input layer IL. In response to this, the product-sum operation of weight coefficients $w_{ij}$ is performed for each input data $x_i$, so that j pieces of data $y_j$ are generated in the intermediate layer ML. Further, by performing the product-sum operation of weight coefficients $w_{jk}$ for the j pieces of data $y_j$, k pieces of data $z_k$ are generated in the output layer OL. Then, the k pieces of data $z_k$ are output as output data $o_k$.

As a specific example, the case where data is propagated from the intermediate layer ML to the output layer OL is assumed. In this case, the data ($y_1$, $y_2$, $y_3$) of the intermediate layer ML are subjected to the product-sum operation using the matrix W including ($w_{11}$, $w_{21}$, $w_{31}$) in the column direction. Such an inference operation is referred to as the forward propagation (FP). Note that the intermediate layer ML is not limited to a single layer and may be multiple layers. Here, the neural network NN like this can be mounted in the arithmetic operation memory PIM.

Figure 3:
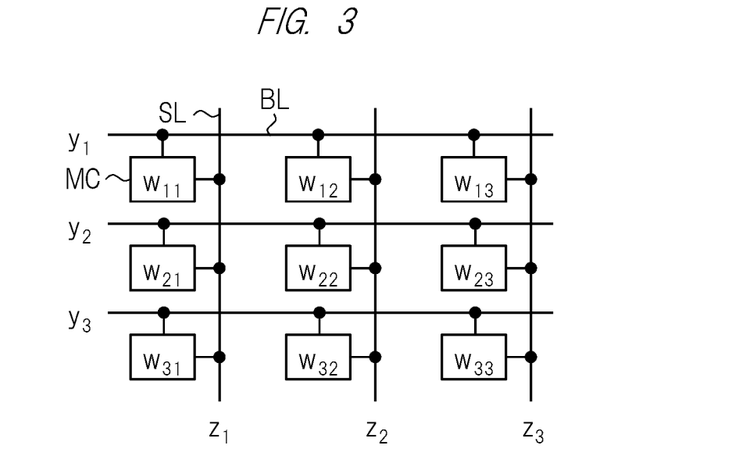
FIG. 3 is a schematic diagram showing a basic configuration example in the case where a neural network of FIG. 2 is mounted in an arithmetic operation memory.

FIG. 3 is a schematic diagram showing a basic configuration example in the case where the neural network of FIG. 2 is mounted in an arithmetic memory. FIG. 3 shows a configuration example of the neural network NN between the intermediate layer ML and the output layer OL in FIG. 2. Each data $y_1$ to $y_3$ of the intermediate layer ML serves as an input and is represented by each voltage value of the three bit lines BL. On the other hand, each data $z_1$ to $z_3$ of the output layer OL serves as an output and is represented by each current value of the three source lines SL. Also, the weight coefficients $w_{jk}$ are represented by the electrical characteristics (for example, the current characteristics with respect to the applied voltage) of the memory cells MC arranged at the intersections of the three bit lines BL and the three source lines SL.

Figure 4:
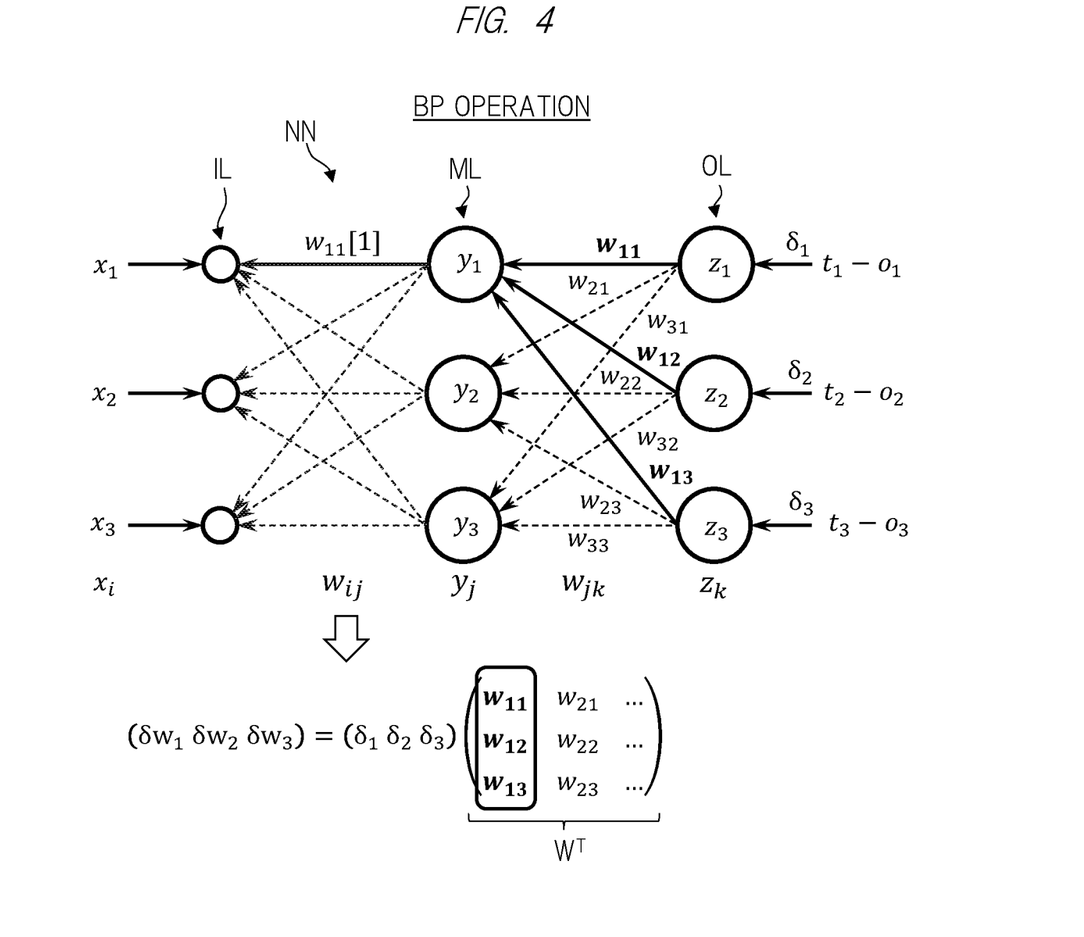
FIG. 4 is a schematic diagram illustrating an example of an error correction operation in the learning of the AI.

FIG. 4 is a schematic diagram illustrating an example of an error correction operation in the learning in AI. The back propagation (BP) is widely known as a method of the learning operation. In the back propagation (BP), the following process [A] and process [B] are performed. In the process [A], the forward propagation (FP) of FIG. 2 is performed, and the error data $\delta_k$ is calculated based on the difference between the teaching data $t_k$ and the output data $o_k$. In the process [B], the calculated error data $\delta_k$ is propagated sequentially from the output layer OL to the input layer IL, contrary to the case of the forward propagation (FP), so that the correction amount of each weight coefficient is calculated. Note that the correction amount of each weight coefficient calculated by the error correction operation is separately used when actually updating each weight coefficient.

As a specific example, as shown in FIG. 4, the case of calculating the correction amount of the weight coefficient $W_{11}[1]$ between the input layer IL and the intermediate layer ML is assumed. In this case, it is necessary to propagate the error data $\delta_1$, $\delta_2$, and $\delta_3$ from the output layer OL to the intermediate layer ML by using the weight coefficients $w_{11}$, $w_{12}$, and $w_{13}$, respectively. Namely, as shown in FIG. 4, the product-sum operation using the matrix $W^T$ including ($w_{11}$, $w_{12}$, $w_{13}$) in the column direction is performed for the error data ($\delta_1$, $\delta_2$, $\delta_3$). Note that the error data $\delta_1$, $\delta_2$, and $\delta_3$ are calculated based on the difference between the teaching data $t_1$, $t_2$, and $t_3$ and the output data $o_1$, $o_2$, $o_3$, respectively.

As described above, in the back propagation (BP), unlike the matrix W used in the forward propagation (FP) of FIG. 3, the operation using the transposed matrix $W^T$ of the matrix W is necessary. Here, the operation using the transposed matrix $W^T$ can be realized by exchanging the input and the output in the arithmetic operation memory PIM of FIG. 3. Namely, each data $z_1$ to $z_3$ of the output layer OL becomes the input instead of the output, and is represented by each voltage value of the source line SL. On the other hand, each data $y_1$ to $y_3$ of the intermediate layer ML becomes the output instead of the input, and is represented by each current value of the bit line BL.

By mounting the neural network NN in the arithmetic operation memory PIM in this manner, it becomes possible to realize the matrix operation and the transposed matrix operation at high speed or low power consumption. Namely, the arithmetic operation processing can be performed by utilizing the memory configuration and the electrical characteristics of the memory cell instead of a processor such as a CPU or GPU.

Schematic Configuration and Operation of Arithmetic Operation Memory

Figure 5:
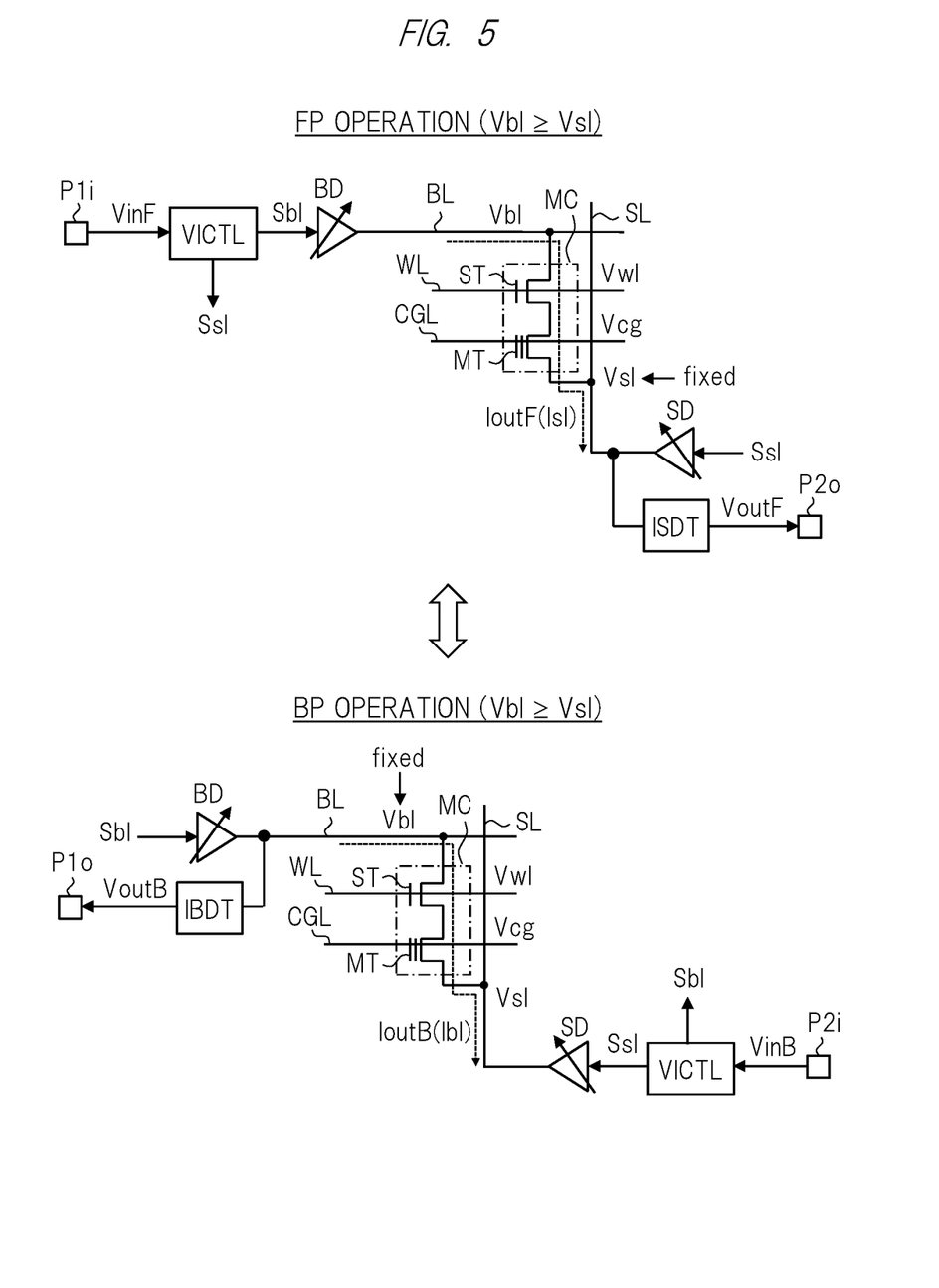
FIG. 5 is a schematic diagram showing a schematic configuration example of a main part of the arithmetic operation memory in FIG. 1 and an operation example thereof.

FIG. 5 is a schematic diagram showing a schematic configuration example of a main part of the arithmetic operation memory in FIG. 1 and an operation example thereof. FIG. 5 shows each operation in the forward propagation (FP) and the back propagation (BP) described with reference to FIG. 2 to FIG. 4 and the basic configuration of the arithmetic operation memory PIM executing each operation. First, the basic configuration of the arithmetic operation memory PIM in the forward propagation (FP) will be described.

An input terminal (first terminal) P1$i$ is provided so as to correspond to the bit line (first wiring) BL, and for example, the data $y_j$ of the intermediate layer ML in FIG. 2 is input to the input terminal (first terminal) P1$i$. An output terminal (second terminal) P2$o$ is provided so as to correspond to the source line (second wiring) SL, and outputs, for example, the data $z_k$ of the output layer OL in FIG. 2. The bit line BL and the source line SL are arranged in the directions intersecting with each other. Also, the memory cell MC is arranged at the intersection of the bit line BL and the source line SL.

In this example, the memory cell MC is a flash memory cell including a memory cell transistor MT and a selection transistor ST. The memory cell transistor MT has the gate connected to a control gate line (third wiring) CGL, and stores the information based on the magnitude of the threshold voltage (Vt). Namely, the memory cell transistor MT stores, for example, the weight coefficient $w_{jk}$ in FIG. 2 based on the magnitude of the threshold voltage (Vt). In this specification, the control gate is abbreviated as CG.

On the other hand, the selection transistor ST is connected in series with the memory cell transistor MT between the bit line BL and the source line SL, and has the gate connected to the word line (fourth wiring) WL. Specifically, one end of the selection transistor ST is connected to the bit line BL, and one end of the memory cell transistor MT is connected to the source line SL. The selection transistor ST is controlled to the ON state via the word line WL when the memory cell MC serves as the memory cell to be accessed.

A bit line driver (first voltage application circuit) BD applies a bit line voltage Vbl determined to have a predetermined voltage value to the bit line BL. On the other hand, a source line driver (second voltage application circuit) SD applies a source line voltage Vsl determined to have a predetermined voltage value to the source line SL. Here, each voltage value of the bit line BL and the source line SL is determined by a voltage control circuit VICTL.

The voltage control circuit VICTL fixes the voltage value of the source line voltage Vsl by outputting a voltage control signal Ssl to the source line driver SD when receiving the input value (for example, voltage value) VinF from the input terminal P1$i$. In this state, the voltage control circuit VICTL outputs a voltage control signal Sbl to the bit line driver BD, thereby changing the voltage value of the bit line voltage Vbl with a positive inclination with respect to the input value VinF within the range equal to or higher than the voltage value of the source line voltage Vsl. Namely, the voltage control circuit VICTL controls the voltage such that the bit line voltage Vbl is equal to or higher than the source line voltage Vsl (Vbl≥Vsl).

As a result, an output current IoutF (source line current Isl) that is changed in accordance with the bit line voltage Vbl (or input value VinF) and is weighted by the memory cell transistor MT flows from the bit line BL to the source line SL. A source line current detection circuit (second current detection circuit) ISDT detects the output current IoutF flowing through the source line SL, converts it into an output value (for example, voltage value) VoutF, and outputs it to the output terminal P2$o$.

Next, the basic configuration of the arithmetic operation memory PIM in the back propagation (BP) will be described. An input terminal P2$i$ is provided so as to correspond to the source line SL, and for example, the data (error data $\delta_k$) from the output layer OL in FIG. 4 is input to the input terminal P2$i$. An output terminal P1$o$ is provided so as to correspond to the bit line BL, and outputs, for example, the data (error data $\delta w_j$) of the intermediate layer ML directed to the input layer IL in FIG. 4.

Here, the voltage control circuit VICTL fixes the voltage value of the bit line voltage Vbl by outputting a voltage control signal Sbl to the bit line driver BD when receiving the input value (for example, voltage value) VinB from the input terminal P2$i$, contrary to the case of the forward propagation (FP). In this state, the voltage control circuit VICTL outputs a voltage control signal Ssl to the source line driver SD, thereby changing the voltage value of the source line voltage Vsl with a negative inclination with respect to the input value VinB within the range equal to or lower than the voltage value of the bit line voltage Vbl. Namely, the voltage control circuit VICTL controls each voltage such that the bit line voltage Vbl is equal to or higher than the source line voltage Vsl (Vbl≥Vsl) even in the back propagation (BP) as in the case of the forward propagation (FP).

As a result, an output current IoutB (bit line current Ibl) that is changed in accordance with the source line voltage Vsl (or input value VinB) and is weighted by the memory cell transistor MT flows from the bit line BL to the source line SL. A bit line current detection circuit (first current detection circuit) IBDT detects the output current IoutB flowing through the bit line BL, converts it into an output value (for example, voltage value) VoutB, and outputs it to the output terminal P1$o$.

Here, for example, in the cross-point RRAM shown in Non-Patent Document 1, a symmetric memory cell is used. The symmetric memory cell has a characteristic that, when the voltage of the bit line BL and the voltage of the source line SL are exchanged, only the direction of the flowing current is varied and the magnitude of the flowing current is the same. Therefore, the matrix operation and the transposed matrix operation can be realized by simply exchanging the voltages between the forward propagation (FP) and the back propagation (BP).

However, for example, the memory cell (flash memory cell) MC shown in FIG. 5 is an asymmetric memory cell. The asymmetric memory cell has a characteristic that, when the voltage of the bit line BL and the voltage of the source line SL are exchanged, the magnitude of the flowing current is also varied in addition to the direction of the flowing current. Therefore, it is beneficial to control such that the magnitude relationship between the voltage of the bit line BL and the voltage of the source line SL does not change between the forward propagation (FP) and the back propagation (BP) by the method shown in FIG. 5.

Here, in particular, the manufacturing process of the flash memory is more matured as compared with that of the cross-point RRAM or the like. Further, by providing the selection transistor ST in the memory cell MC, the problem of reliability in the cross-point RRAM does not occur. Therefore, by using the flash memory cell as the asymmetric memory cell, beneficial effects can be obtained from the viewpoint of cost, reliability, and the like. However, the asymmetric memory cell is not limited to the flash memory cell, and may be, for example, an RRAM memory cell provided with a selection transistor and a resistive element.

Figure 6:
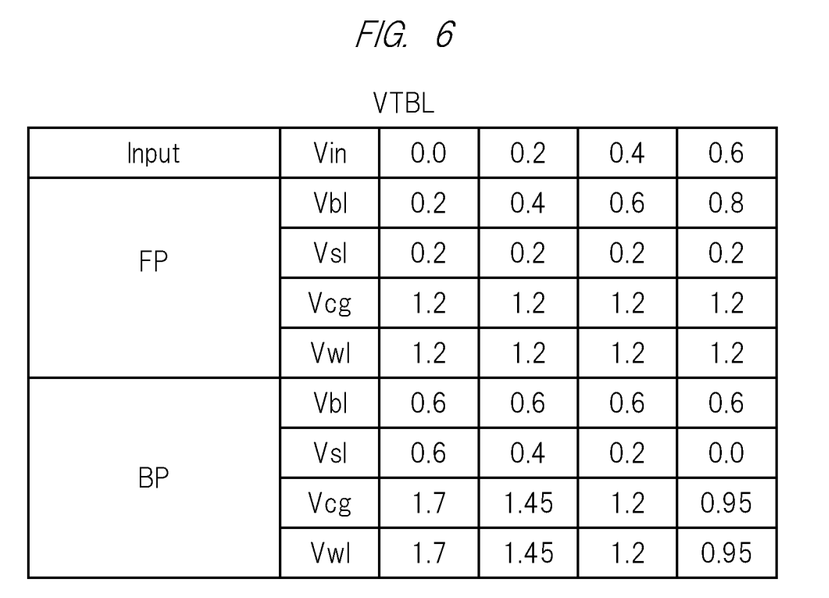
FIG. 6 is a diagram illustrating a detailed operation example of a voltage control circuit in FIG. 5.

FIG. 6 is a diagram illustrating a detailed operation example of the voltage control circuit in FIG. 5. The voltage control circuit VICTL has, for example, a voltage setting table VTBL shown in FIG. 6, and determines each voltage based on the voltage setting table VTBL. The voltage setting table VTBL stores the correspondence relationship between the input value Vin (VinF) of the forward propagation (FP) and each voltage value of the bit line voltage Vbl, the source line voltage Vsl, a CG line voltage Vcg, and a word line voltage Vwl. The CG line voltage Vcg is the voltage of the CG line CGL, and the word line voltage Vwl is the voltage of the word line WL.

In this example, the voltage control circuit VICTL fixes the voltage value of the source line voltage Vsl to 0.2 V when receiving the input value Vin (VinF) of the forward propagation (FP). Then, the voltage control circuit VICTL changes the voltage value of the bit line voltage Vbl within the range from 0.2 to 0.8 V in accordance with the input value VinF of 0.0 to 0.6. At this time, the input value Vin (for example, the voltage value [V]) is reflected in "bit line voltage Vbl−source line voltage Vsl" (Vbl−Vsl).

In addition, the voltage control circuit VICTL determines each voltage value of the CG line voltage Vcg and the word line voltage Vwl so as to have a constant potential difference (1.0 V in this example) with reference to the source line voltage Vsl (0.2 V). Namely, each voltage value of the CG line voltage Vcg and the word line voltage Vwl is set to 1.2 V.

Furthermore, the voltage setting table VTBL stores the correspondence relationship between the input value Vin (VinB) of the back propagation (BP) and each voltage value of the bit line voltage Vbl, the source line voltage Vsl, the CG line voltage Vcg, and the word line voltage Vwl. In this example, the voltage control circuit VICTL fixes the voltage value of the bit line voltage Vbl to 0.6 V when receiving the input value Vin (VinB) of the back propagation (BP). Then, the voltage control circuit VICTL changes the voltage value of the source line voltage Vsl within the range from 0.6 to 0.0 V in accordance with the input value VinB of 0.0 to 0.6.

Further, the voltage control circuit VICTL determines each voltage value of the CG line voltage Vcg and the word line voltage Vwl so as to follow the change of the source line voltage Vsl (0.6 to 0.0 V). In this case, unlike the case of the forward propagation (FP), the change in the back bias effect due to the change in the source line voltage Vsl is corrected. For example, when the voltage value of the source line voltage Vsl is 0.6 V, each voltage value of the CG line voltage Vcg and the word line voltage Vwl is set to 1.7 V instead of 1.6 V. Also, when the voltage value of the source line voltage Vsl is 0.0 V, each voltage value of the CG line voltage Vcg and the word line voltage Vwl is set to 0.95 V instead of 1.0 V.

Note that, when a value between the input values Vin defined in the voltage setting table VTBL of FIG. 6 is input, the voltage control circuit VICTL determines each voltage value by performing linear interpolation as appropriate. For example, when receiving 0.1 as the input value Vin (VinF) of the forward propagation (FP), the voltage control circuit VICTL may determine the voltage value of the bit line voltage Vbl to 0.3 V. Further, the voltage control circuit VICTL can determine each voltage value by using, for example, a mathematical formula or the like corresponding to the voltage setting table VTBL other than the voltage setting table VTBL described above.

Figure 7:
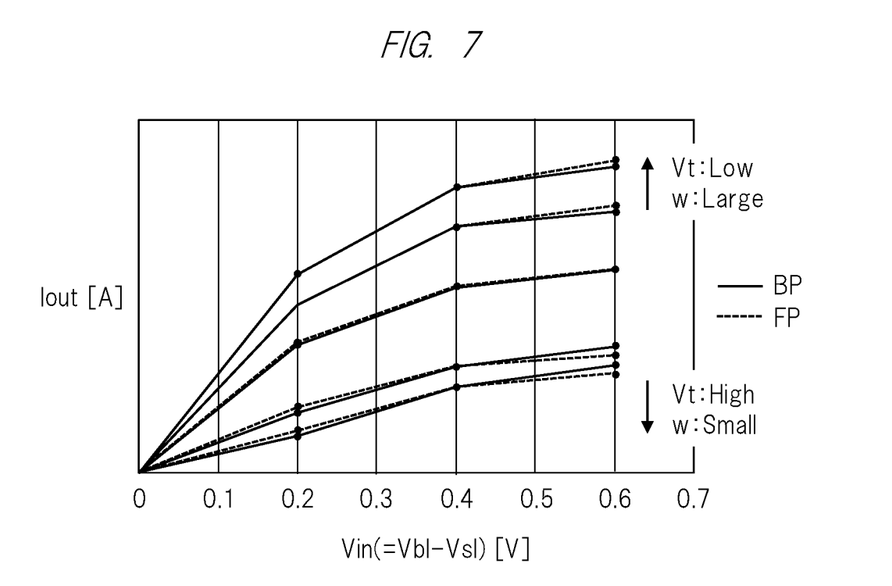
FIG. 7 is a diagram showing an example of verification results of electrical characteristics in the case where the arithmetic operation memory of FIG. 5 is operated based on the voltage setting table of FIG. 6.

FIG. 7 is a diagram showing an example of verification results of electrical characteristics in the case where the arithmetic operation memory of FIG. 5 is operated based on the voltage setting table of FIG. 6. In FIG. 7, the horizontal axis represents the input value Vin (VinF, VinB) [V], and the vertical axis represents the output current Iout (IoutF, IoutB) [A]. As shown in FIG. 7, it is possible to realize the same characteristics in the forward propagation (FP) and the back propagation (BP) by using the control method of FIG. 5 and adding the correction of the back bias effect described with reference to FIG. 6. As shown in FIG. 7, the output current Iout (or weight coefficient w) becomes larger when the threshold voltage (Vt) of the memory cell transistor MT is low, and becomes smaller when the threshold voltage (Vt) is high.

Details of Arithmetic Operation Memory

Figure 8:
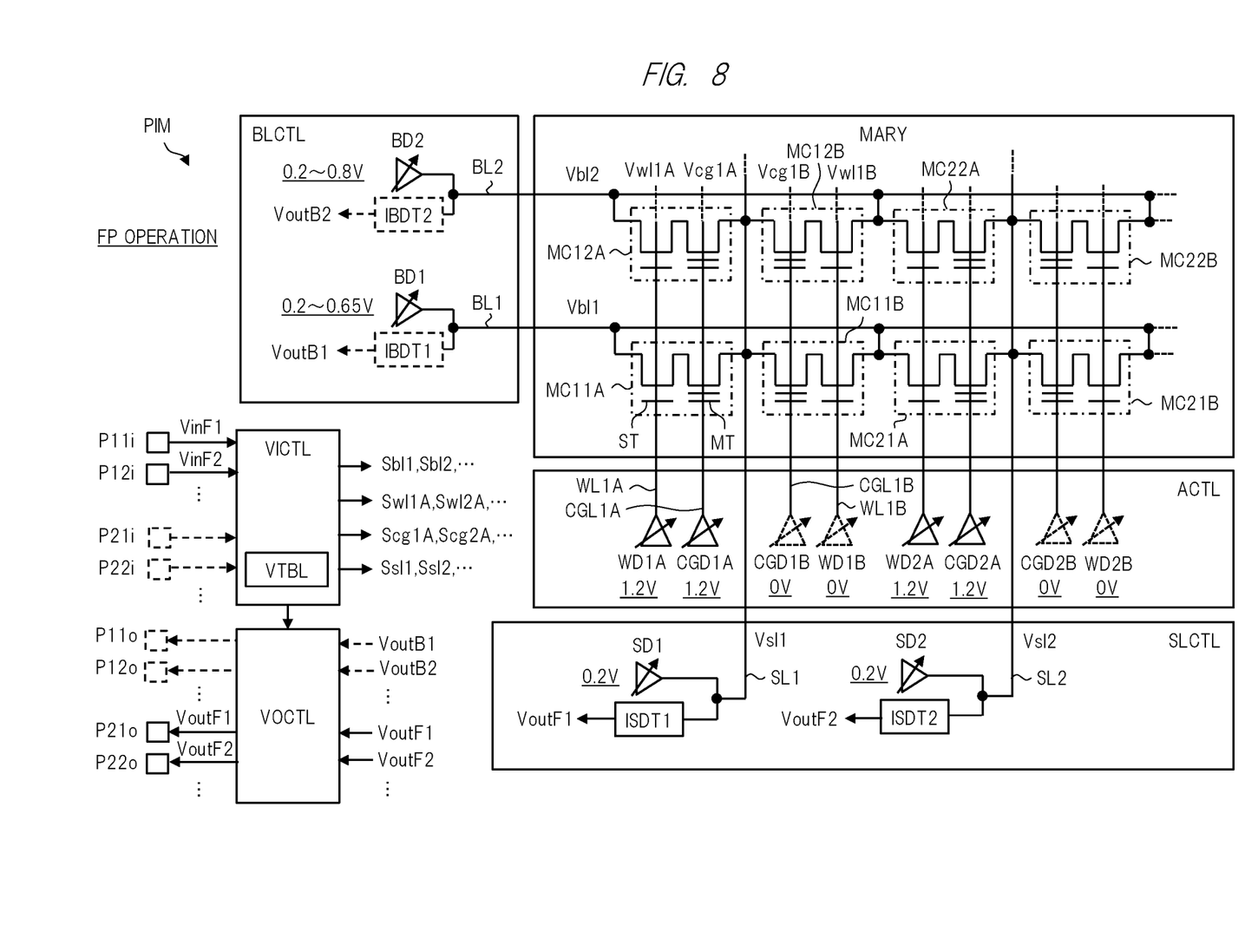
FIG. 8 is a circuit diagram showing a more detailed configuration example of the main part of the arithmetic operation memory in FIG. 1 and an operation example thereof in a forward propagation (FP).
Figure 9:
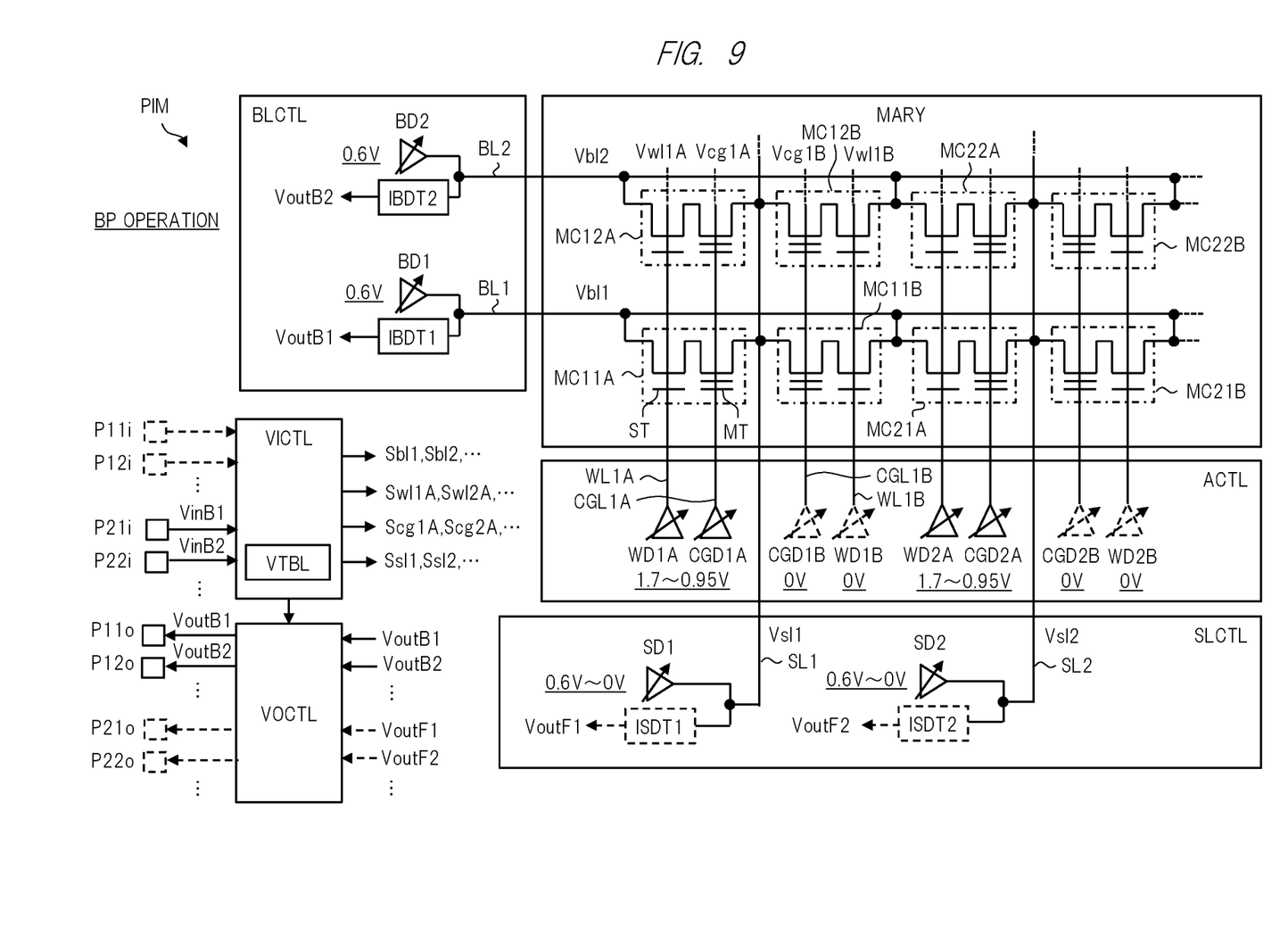
FIG. 9 is a circuit diagram showing a configuration and an operation example in a back propagation (BP) unlike FIG. 8.

FIG. 8 is a circuit diagram showing a more detailed configuration example of the main part of the arithmetic operation memory in FIG. 1 and an operation example thereof in the forward propagation (FP). FIG. 9 is a circuit diagram showing a configuration example and an operation example in the back propagation (BP) unlike FIG. 8. The arithmetic operation memory PIM shown in FIG. 8 and FIG. 9 includes a memory array MARY, an array control circuit ACTL, a bit line control circuit BLCTL, a source line control circuit SLCTL, the voltage control circuit VICTL, and an output control circuit VOCTL.

The memory array MARY includes a plurality of bit lines BLm (m=1, 2, . . . ), a plurality of source lines SLn (n=1, 2, . . . ), a plurality of word lines WLnA and WLnB (n=1, 2, . . . ), a plurality of CG lines CGLnA and CGLnB (n=1, 2, . . . ), and a plurality of memory cells MCnmA and MCnmB (n=1, 2, . . . , m=1, 2, . . . ). Here "n" represents the identification number in the row direction, and "m" represents the identification number in the column direction intersecting with the row direction.

The plurality of word lines WLnA and WLnB, the plurality of CG lines CGLnA and CGLnB, and the plurality of source lines SLn are all arranged in the row direction. On the other hand, the plurality of bit lines BLm are arranged in the column direction. The memory cell MCnmA is arranged at each of the intersections of the plurality of word lines WLnA (or CG lines CGLnA) and the plurality of bit lines BLm. Similarly, the memory cell MCnmB is arranged at each of the intersections of the plurality of word lines WLnB (or CG lines CGLnB) and the plurality of bit lines BLm.

In this example, two memory cells MCnmA and MCnmB (for example, MC11A and MC11B) arranged adjacent to each other share a source line SLn (SL1). Therefore, two memory cells MCnmA and MCnmB are arranged at the intersection of one bit line BLm and one source line SLn. By sharing the source line SLn in this manner, it is possible to increase the degree of integration of the arithmetic operation memory PIM. In this case, however, for example, a configuration in which two memory cells MC are arranged instead of one memory cell MC in FIG. 3 is formed. Therefore, it is necessary to separate the two memory cells MC in some way.

For this reason, for example, in the case of the neural network NN including a plurality of intermediate layers ML, one of the two memory cells MCnmA and MCnmB should be configured to mount a certain intermediate layer ML and the other of the two memory cells MCnmA and MCnmB should be configured to mount another intermediate layer ML. By dividing the corresponding layers in this manner and eliminating the need to access the two memory cells MCnmA and MCnmB at the same time, it is possible to realize a desired operation while increasing the degree of integration.

The array control circuit ACTL includes a plurality of word line drivers WDnA and WDnB (n=1, 2, . . . ) and a plurality of CG line drivers CGDnA and CGDnB (n=1, 2, . . . ). The plurality of word line drivers WDnA and WDnB apply word line voltages VwlnA and VwlnB (n=1, 2, . . . ) to the plurality of word lines WLnA and WLnB, respectively. The plurality of CG line drivers CGDnA and CGDnB apply CG line voltages VcgnA and VcgnB (n=1, 2, . . . ) to the plurality of CG lines CGLnA and CGLnB, respectively. In the following, the operation of a certain intermediate layer ML is targeted, and the description will be given on the assumption that the word line voltage VwlnB and the CG line voltage VcgnB used in another intermediate layer ML are fixed to 0 V (or the memory cell MCnmB is not accessed) as described above.

The bit line control circuit BLCTL includes bit line drivers BDm (m=1, 2, . . . ) and bit line current detection circuits IBDTm (m=1, 2, . . . ) shown in FIG. 5 so as to correspond to each bit line BLm. The source line control circuit SLCTL includes source line drivers SDn (n=1, 2, . . . ) and source line current detection circuits ISDTn (n=1, 2, . . . ) shown in FIG. 5 so as to correspond to each source line SLn.

The voltage control circuit VICTL includes the voltage setting table VTBL shown in FIG. 6. Further, input values (Vin) from input terminals P11$i$, P12$i$, . . . , P21$i$, P22$i$, . . . are input to the voltage control circuit VICTL. The input terminals P11$i$, P12$i$, . . . correspond to, for example, each node ($y_1$, $y_2$, . . . ) of the intermediate layer ML in FIG. 2. On the other hand, the input terminals P21$i$, P22$i$, . . . correspond to, for example, each node ($z_1$, $z_2$, . . . ) of the output layer OL in FIG. 4.

The voltage control circuit VICTL determines the forward propagation (FP) or the back propagation (BP) based on whether the input is from the input terminals P11$i$, P12$i$, . . . or from the input terminals P21$i$, P22$i$, . . . . Then, the voltage control circuit VICTL outputs each voltage control signal for determining each voltage value based on the voltage setting table VTBL. Specifically, the voltage control signals Sbl1, Sbl2, . . . instruct the bit line drivers BD1, BD2, . . . about the voltage values of the bit line voltages Vbl1, Vbl2, . . . .

Also, the voltage control signals Swl1A, Swl2A, . . . instruct the word line drivers WD1A, WD2A, . . . about the voltage values of the word line voltages Vwl1A, Vwl2A, . . . . The voltage control signals Scg1A, Scg2A, . . . instruct the CG line drivers CGD1A, CGD2A, . . . about the voltage values of the CG line voltages Vcgl1A, Vcg2A, . . . . The voltage control signals Ssl1, Ssl2, . . . instruct the source line drivers SD1, SD2, . . . about the voltage values of the source line voltages Vsl1, Vsl2, . . . .

The output values VoutF1, VoutF2, . . . from the source line current detection circuits ISDT1, ISDT2, . . . and the output values VoutB1, VoutB2, . . . from the bit line current detection circuits IBDT1, IBDT2, . . . are input to the output control circuit VOCTL. The output control circuit VOCTL selects either the output values VoutF1, VoutF2, . . . or the output values VoutB1, VoutB2, . . . based on the determination result of the forward propagation (FP) or the back propagation (BP) from the voltage control circuit VICTL.

Then, the output control circuit VOCTL outputs the selected output value to the corresponding output terminals P11$o$, P12$o$, . . . , P21$o$, P22$o$, . . . . The output terminals P11$o$, P12$o$, . . . correspond to, for example, each node ($y_1$, $y_2$, . . . ) of the intermediate layer ML in FIG. 4, respectively. On the other hand, the output terminals P21$o$, P22$o$, . . . correspond to, for example, each node ($z_1$, $z_2$, . . . ) of the output layer OL in FIG. 2, respectively.

In the configuration described above, the main operation in the forward propagation (FP) of FIG. 8 will be described. Here, for the simplification of the description, the case where there are two bit lines BL and two source lines SL is assumed. First, the voltage control circuit VICTL controls the bit line voltages Vbl1 and Vbl2 in accordance with the input values VinF1 and VinF2 from the input terminals P11$i$ and P12$i$, respectively.

In response to this, a current obtained by adding the current based on the bit line voltage Vbl1 and the weight coefficient of the memory cell MC11A and the current based on the bit line voltage Vbl2 and the weight coefficient of the memory cell MC12A flows through the source line SL1. The source line current detection circuit ISDT1 detects this added current and converts it into a voltage value, thereby outputting the output value VoutF1. Similarly, a current obtained by adding the current based on the bit line voltage Vbl1 and the weight coefficient of the memory cell MC21A and the current based on the bit line voltage Vbl2 and the weight coefficient of the memory cell MC22A flows through the source line SL2. The source line current detection circuit ISDT2 detects this added current and converts it into a voltage value, thereby outputting the output value VoutF2.

The output control circuit VOCTL outputs the output values VoutF1 and VoutF2 to the output terminals P21$o$ and P22$o$, respectively. As described above, in the forward propagation (FP), the product-sum operation of the input values VinF1 and VinF2 from the input terminals P11$i$ and P12$i$ (each node ($y_1$, $y_2$) of the intermediate layer ML in FIG. 2) is performedusing the weight coefficients of the matrix, and the result thereof is output to the output terminals P21$o$ and P22$o$ (each node ($z_1$, $z_2$) of the output layer OL in FIG. 2).

Next, the main operation in the back propagation (BP) of FIG. 9 will be described. The case where there are two bit lines BL and two source lines SL is assumed again. First, the voltage control circuit VICTL controls the source line voltages Vsl1 and Vsl2 in accordance with the input values VinB1 and VinB2 from the input terminals P21$i$ and P22$i$, respectively.

In response to this, a current obtained by adding the current based on the source line voltage Vsl1 and the weight coefficient of the memory cell MC11A and the current based on the source line voltage Vsl2 and the weight coefficient of the memory cell MC21A flows through the bit line BL1. The bit line current detection circuit IBDT1 detects this added current and converts it into a voltage value, thereby outputting the output value VoutB1. Similarly, a current obtained by adding the current based on the source line voltage Vsl1 and the weight coefficient of the memory cell MC12A and the current based on the source line voltage Vsl2 and the weight coefficient of the memory cell MC22A flows through the bit line BL2. The bit line current detection circuit IBDT2 detects this added current and converts it into a voltage value, thereby outputting the output value VoutB2.

The output control circuit VOCTL outputs the output values VoutB1 and VoutB2 to the output terminals P11o and P12o, respectively. As described above, in the back propagation (BP), the product-sum operation of the input values VinB1 and VinB2 from the input terminals P21i and P22i (each node ($z_1$, $z_2$) of the output layer OL in FIG. 4) is performed using the weight coefficients of the transposed matrix, and the result thereof is output to the output terminals P11o and P12o (each node ($y_1$, $y_2$) of the intermediate layer ML in FIG. 4).

Here, the input terminals P11i, P12i, P21i, and P22i may be used in common with the output terminals P11o, P12o, P21o, and P22o, respectively. Namely, for example, the input terminal P11i and the output terminal P11o may be used in common as an input/output terminal (P11). In this case, for example, the output control circuit VOCTL should be configured to control the output terminals P11o and P12o to high impedance such that the input and the output do not collide with each other in FIG. 8.

Figure 10:
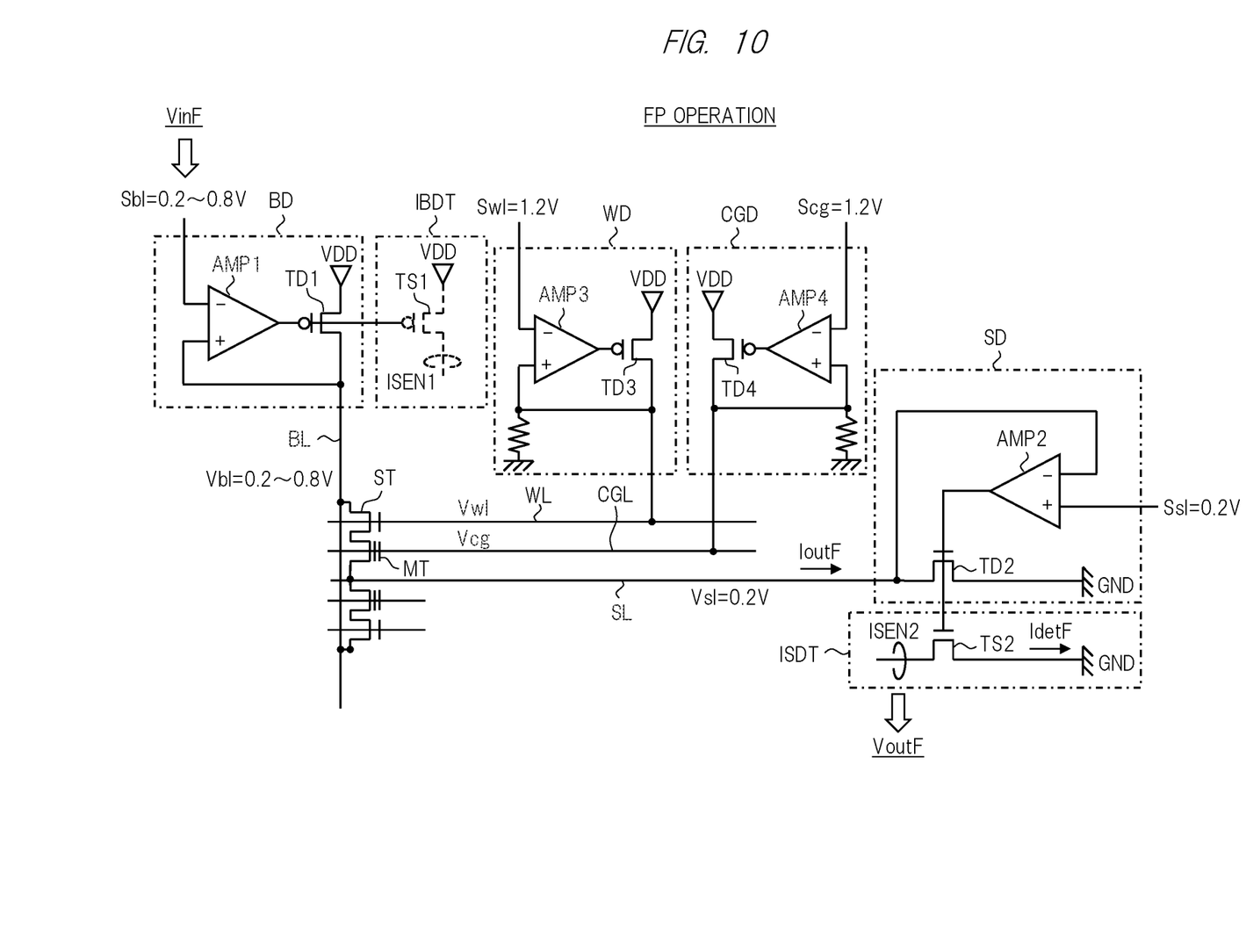
FIG. 10 is a circuit diagram showing a more detailed configuration example of each peripheral circuit in FIG. 8 and an operation example thereof.
Figure 11:
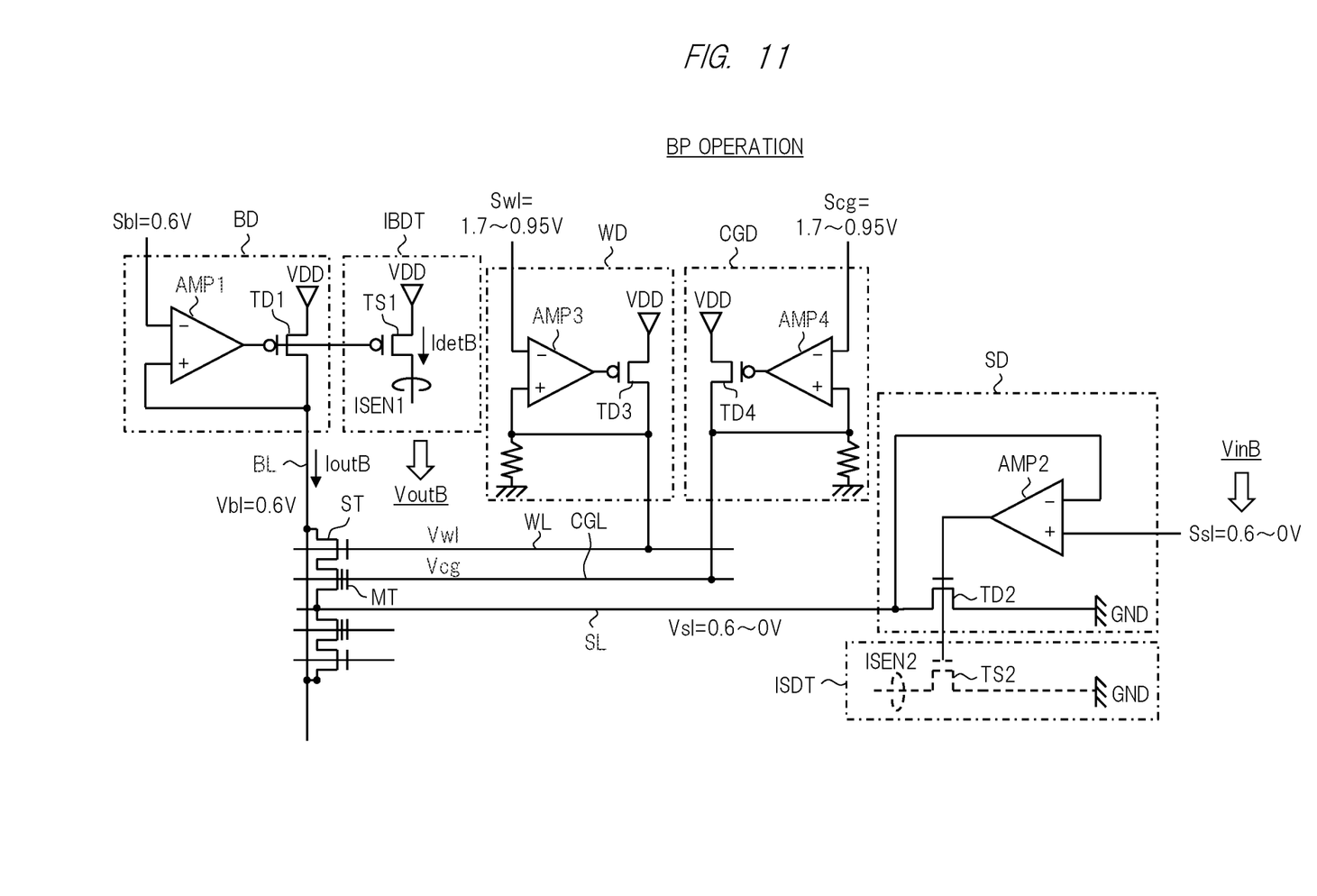
FIG. 11 is a circuit diagram showing a more detailed configuration example of each peripheral circuit in FIG. 9 and an operation example thereof.

FIG. 10 is a circuit diagram showing a more detailed configuration example of each peripheral circuit in FIG. 8 and an operation example thereof. FIG. 11 is a circuit diagram showing a more detailed configuration example of each peripheral circuit in FIG. 9 and an operation example thereof. In FIG. 10 and FIG. 11, the bit line driver BD includes a drive transistor TD1 and an amplifier circuit AMP1. The amplifier circuit AMP1 controls the gate of the drive transistor TD1 by negative feedback such that the output voltage value of the drive transistor TD1 (that is, the voltage value of the bit line voltage Vbl) becomes the value indicated by the voltage control signal Sbl.

The bit line current detection circuit IBDT includes a sense transistor TS1 and a current sensor ISEN1. The sense transistor TS1 constitutes a current mirror circuit together with the drive transistor TD1. The current sensor ISEN1 detects the current flowing through the sense transistor TS1by, for example, a resistive element or the like.

The source line driver SD includes a drive transistor TD2 and an amplifier circuit AMP2. The amplifier circuit AMP2 controls the gate of the drive transistor TD2 by negative feedback such that the output voltage value of the drive transistor TD2 (that is, the voltage value of the source line voltage Vsl) becomes the value indicated by the voltage control signal Ssl. The source line current detection circuit ISDT includes a sense transistor TS2 and a current sensor ISEN2. The sense transistor TS2 constitutes a current mirror circuit together with the drive transistor TD2. The current sensor ISEN2 detects the current flowing through the sense transistor TS2 by, for example, a resistive element or the like.

The word line driver WD includes a drive transistor TD3 and an amplifier circuit AMP3. The amplifier circuit AMP3 controls the gate of the drive transistor TD3 by negative feedback such that the output voltage value of the drive transistor TD3 (that is, the voltage value of the word line voltage Vwl) becomes the value indicated by the voltage control signal Swl. The CG line driver CGD includes a drive transistor TD4 and an amplifier circuit AMP4. The amplifier circuit AMP4 controls the gate of the drive transistor TD4 by negative feedback such that the output voltage value of the drive transistor TD4 (that is, the voltage value of the CG line voltage Vcg) becomes the value indicated by the voltage control signal Scg.

In the forward propagation (FP) of FIG. 10, the input value VinF is input toward the bit line BL, and the output current IoutF flows through the source line SL. The current sensor ISEN2 detects the detection current IdetF flowing through the sense transistor TS2 in accordance with the output current IoutF, and outputs the output value VoutF. On the other hand, in the back propagation (BP) of FIG. 11, the input value VinB is input toward the source line SL, and the output current IoutB flows through the bit line BL. The current sensor ISEN1 detects the detection current IdetB flowing through the sense transistor TS1 in accordance with the output current IoutB, and outputs the output value VoutB.

Modification of Voltage Setting Table

Figure 12:
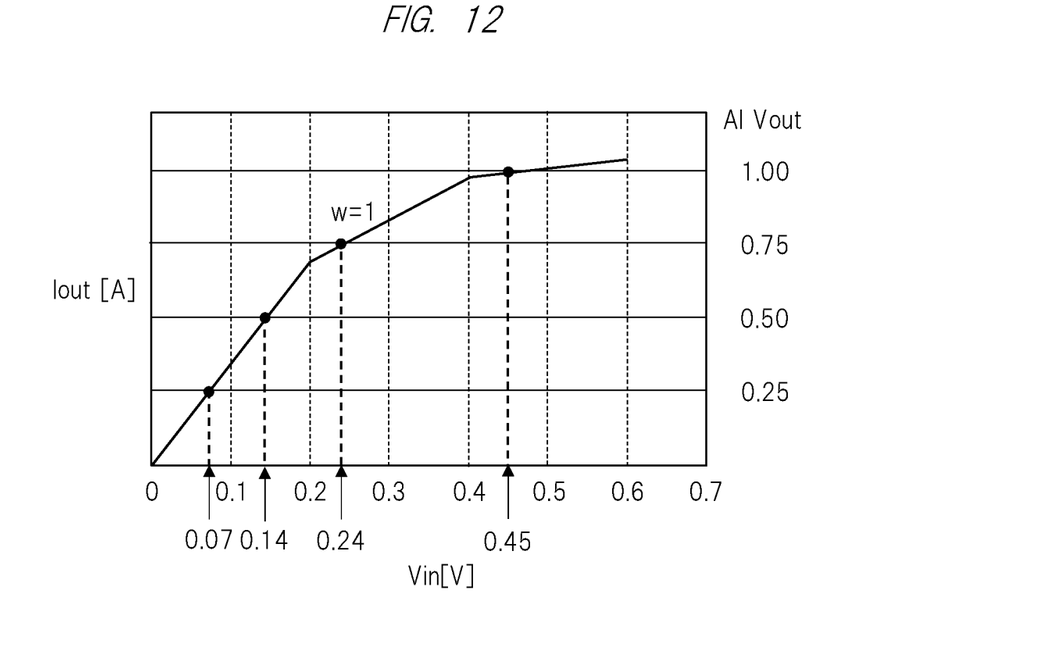
FIG. 12 is a diagram in which some of the characteristics in FIG. 7 are extracted.

FIG. 12 is a diagram in which some of the characteristics in FIG. 7 are extracted. For example, the memory cell transistor MT in FIG. 5 is operated mainly in the linear region. However, strictly speaking, as shown in FIG. 12, the relationship between voltage and current can be a non-linear characteristic. Accordingly, the relationship between the input value from AI and the output value to AI can also be a non-linear characteristic. Therefore, correction may be performed so as to maintain the linearity.

In the example of FIG. 12, for example, when the input value from AI (AI Vin) is 0.00, 0.25, 0.50, 0.75, and 1.00, the input value Vin to the arithmetic operation memory PIM is corrected such that the output value to AI (AI Vout) also becomes 0.00, 0.25, 0.50, 0.75, and 1.00. Specifically, when the input value from AI (AI Vin) is 0.00, 0.25, 0.50, 0.75, and 1.00, the input value Vin to the arithmetic operation memory PIM is corrected to 0.00, 0.07, 0.14, 0.24, and 0.45.

Figure 13:
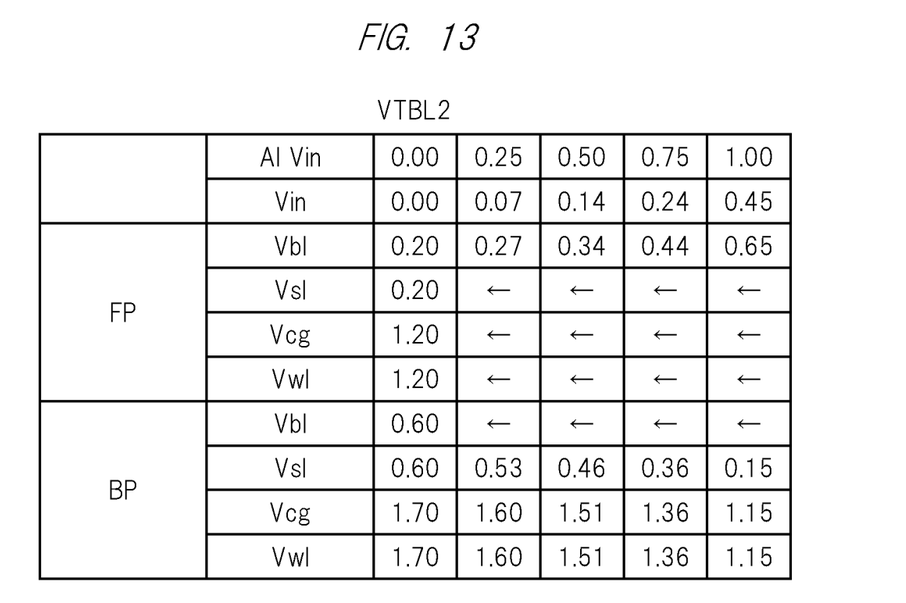
FIG. 13 is a diagram showing a modification of the voltage setting table of FIG. 6 based on the characteristics of FIG. 12.

FIG. 13 is a diagram showing a modification of the voltage setting table of FIG. 6 based on the characteristics of FIG. 12. The voltage control circuit VICTL corrects the input value from AI (AI Vin) to the input value Vin to the arithmetic operation memory PIM based on the voltage setting table VTBL2 shown in FIG. 13. Then, the voltage control circuit VICTL determines each voltage value based on the input value Vin to the arithmetic operation memory PIM. For example, when the input value from AI (AI Vin) is 0.25 in the forward propagation (FP), the input value Vin to the arithmetic operation memory PIM is corrected to 0.07. Accordingly, the voltage value of the bit line voltage Vbl is set to 0.27 V with reference to the voltage value (0.20 V) of the source line voltage Vsl.

Main Effect of Embodiment

As described above, by using the semiconductor device of the embodiment, typically, it is possible to realize the transposed matrix operation with high accuracy even in the asymmetric memory cell. As a result, it becomes possible to construct a neural network using matured design assets represented by flash memory cells, and it is possible to achieve the reduction in cost and the improvement in reliability.

Although the invention made by the inventor has been specifically described above based on embodiments, it goes without saying that the present invention is not limited to the above-described embodiments and examples and can be variously modified.

What is claimed is:

1. A semiconductor device comprising an arithmetic operation memory,
wherein the arithmetic operation memory includes:
a first wiring;
a second wiring;
a first terminal corresponding to the first wiring;
a second terminal corresponding to the second wiring;
an asymmetric memory cell connected between the first wiring and the second wiring and having a characteristic that a magnitude of a flowing current is varied when a voltage of the first wiring and a voltage of the second wiring are exchanged;
a first voltage application circuit configured to apply a first voltage determined to have a first voltage value to the first wiring;
a second voltage application circuit configured to apply a second voltage determined to have a second voltage value to the second wiring; and
a voltage control circuit configured to determine the first voltage value and the second voltage value,
wherein, in a first case of receiving a first input value from the first terminal, the voltage control circuit fixes the second voltage value and changes the first voltage value with a positive inclination with respect to the first input value within a range equal to or higher than the second voltage value, and
wherein, in a second case of receiving a second input value from the second terminal, the voltage control circuit fixes the first voltage value and changes the second voltage value with a negative inclination with respect to the second input value within a range equal to or lower than the first voltage value.

2. The semiconductor device according to claim 1, further comprising:
a second current detection circuit configured to detect a current flowing through the second wiring in the first case; and
a first current detection circuit configured to detect a current flowing through the first wiring in the second case.

3. The semiconductor device according to claim 1,
wherein the asymmetric memory cell includes:
a memory cell transistor having a gate connected to a third wiring and configured to store information based on a magnitude of a threshold voltage; and
a selection transistor connected in series with the memory cell transistor between the first wiring and the second wiring and having a gate connected to a fourth wiring.

4. The semiconductor device according to claim 3,
wherein, in the first case, the voltage control circuit fixes a voltage value of the third wiring and a voltage value of the fourth wiring, and
wherein, in the second case, the voltage control circuit changes the voltage value of the third wiring and the voltage value of the fourth wiring in accordance with the second input value.

5. The semiconductor device according to claim 3,
wherein the voltage control circuit includes a voltage setting table, and
wherein the voltage setting table stores in advance a correspondence relationship between the first input value and the first voltage value, the second voltage value, a voltage value of the third wiring, and a voltage value of the fourth wiring, and a correspondence relationship between the second input value and the first voltage value, the second voltage value, the voltage value of the third wiring, and the voltage value of the fourth wiring.

6. The semiconductor device according to claim 1,
wherein a neural network is mounted in the arithmetic operation memory.

7. The semiconductor device according to claim 6,
wherein a plurality of the first wirings are arranged in a first direction,
wherein a plurality of the second wirings are arranged in a second direction intersecting with the first direction, and
wherein the asymmetric memory cell is arranged at each intersection of the plurality of first wirings and the plurality of second wirings.

8. The semiconductor device according to claim 7,
wherein the neural network having multiple layers including a first layer and a second layer is mounted in the arithmetic operation memory,
wherein two asymmetric memory cells arranged adjacent to each other share the second wiring,
wherein one of the two asymmetric memory cells mounts the first layer, and
wherein the other of the two asymmetric memory cells mounts the second layer.

* * * * *